(12) United States Patent
Aoyama

(10) Patent No.: US 11,214,168 B2
(45) Date of Patent: Jan. 4, 2022

(54) DETERIORATION STATE COMPUTATION METHOD AND DETERIORATION STATE COMPUTATION DEVICE

(71) Applicant: Nissan Motor Co., Ltd., Yokohama (JP)

(72) Inventor: Rei Aoyama, Kanagawa (JP)

(73) Assignee: Nissan Motor Co., Ltd., Yokohama (JP)

( * ) Notice: Subject to any disclaimer, the term of this patent is extended or adjusted under 35 U.S.C. 154(b) by 168 days.

(21) Appl. No.: 16/635,061

(22) PCT Filed: Jul. 31, 2017

(86) PCT No.: PCT/JP2017/027749
§ 371 (c)(1),
(2) Date: Jan. 29, 2020

(87) PCT Pub. No.: WO2019/026142
PCT Pub. Date: Feb. 7, 2019

(65) Prior Publication Data
US 2020/0247268 A1 Aug. 6, 2020

(51) Int. Cl.
*B60L 58/16* (2019.01)
*B60L 58/13* (2019.01)

(52) U.S. Cl.
CPC .............. *B60L 58/16* (2019.02); *B60L 58/13* (2019.02)

(58) Field of Classification Search
None
See application file for complete search history.

(56) References Cited

U.S. PATENT DOCUMENTS

| 10,295,600 B2 * | 5/2019 | Coenen | G01R 31/3842 |
| 2008/0224709 A1 * | 9/2008 | Tae | G01R 31/392 |
| | | | 324/430 |

(Continued)

FOREIGN PATENT DOCUMENTS

| JP | 2014-102076 A | 6/2014 |
| JP | 2014-215181 A | 11/2014 |

(Continued)

*Primary Examiner* — Jared Fureman
*Assistant Examiner* — Joel Barnett
(74) *Attorney, Agent, or Firm* — Young Basile Hanlon & MacFarlane, P.C.

(57) ABSTRACT

A deterioration-state calculation method for a battery comprises: detecting current and voltage of the battery; calculating a charge state based on the detected value; calculating a first deterioration state of the battery for each predetermined period based on an elapsed time from the time use is started and an amount of charge-discharge; calculating a second deterioration state based on a change amount in the charge state of the battery and a change amount of current; calculating the second deterioration state for a plurality of times within the predetermined period; calculating reliability of calculation of the second deterioration state for each of a plurality of the second deterioration states based on the detected value; calculating a correction value of the deterioration state based on the second deterioration state with the reliability of the predetermined reliability or higher; and calculating the deterioration state by correcting the first deterioration state.

8 Claims, 4 Drawing Sheets

(56) References Cited

U.S. PATENT DOCUMENTS

| | | | |
|---|---|---|---|
| 2009/0218987 A1* | 9/2009 | Tominaga | H01M 10/44 320/134 |
| 2010/0244846 A1 | 9/2010 | Desprez et al. | |
| 2016/0197382 A1* | 7/2016 | Sood | G01N 29/26 429/92 |
| 2017/0131364 A1 | 5/2017 | Hosaka et al. | |
| 2017/0176544 A1 | 6/2017 | Shimizu | |

FOREIGN PATENT DOCUMENTS

| | | |
|---|---|---|
| JP | 2015-81823 A | 4/2015 |
| JP | 2017-116522 A | 6/2017 |
| WO | 2016/002398 A1 | 1/2016 |
| WO | 2016/092811 A1 | 6/2016 |

* cited by examiner

DETERIORATION STATE COMPUTATION METHOD AND DETERIORATION STATE COMPUTATION DEVICE

TECHNICAL FIELD

The present invention relates to a deterioration-state calculation method and deterioration-state calculation system.

BACKGROUND

As processing for calculating a full-charge capacity of an electric cell, the following method is known. In a period for calculating fully-charged capacity between a first time and a second time, at the first time and the second time, states of charge (SOC1 and SOC2) are calculated by an OCV, and a change amount $\Delta SOC$ is calculated as a difference between SOC1 and SOC2. In addition, in a period between the first time and the second time, a change amount $\Delta Ah$ of an amount of charge-discharge is calculated by time integrating a current value of output current of an assembled electric cell. Then, based on the change amount $\Delta SOC$ of SOC and the change amount $\Delta Ah$ of the amount of charge-discharge, a the fully-charged capacity Ah is calculated (JP 2014-102076 A).

SUMMARY

However, when a load is not used for a long period of time, for example, the change amounts ($\Delta SOC$ and $\Delta Ah$) cannot be calculated appropriately, and there is a problem that calculation accuracy of the deterioration state becomes low.

A problem to be solved by the present invention is to provide a deterioration-state calculation method and deterioration-state calculation system with higher calculation accuracy of the deterioration state.

To solve the above problem, in the present invention, based on an elapsed time from start time of using a battery and an amount of charge-discharge of the battery, a first deterioration state of the battery is calculated for each predetermined period of time, a second deterioration state of the battery is calculated based on a change amount of a state of charge of the battery and a change amount of the current of the battery, a calculation step for calculating a second deterioration state is executed for a plurality of times within a predetermined period of time, calculation reliability of the second deterioration state calculated for each of the plurality of the second deterioration states, a correction value of a deterioration state is calculated based on the second deterioration state with a reliability of predetermined reliability or higher, and a deterioration state of the battery is calculated by correcting the first deterioration state by a correction value.

According to the present invention, an effect of raising calculation accuracy of the deterioration state can be provided.

DETAILED DESCRIPTION

Figure 1:
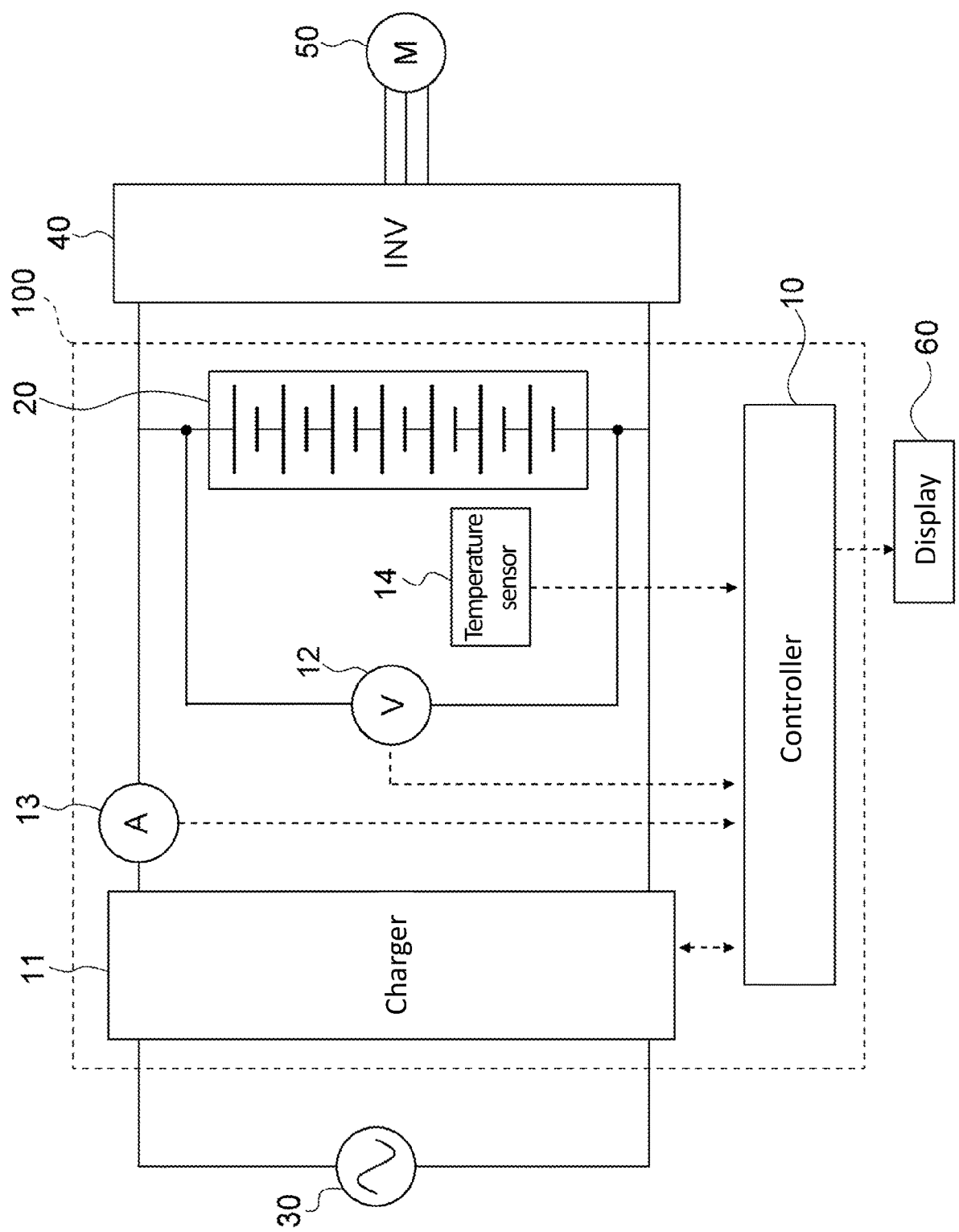
FIG. 1 is a block diagram of a drive system according to the present embodiment.

In the following, embodiments of the present invention will be explained based on the drawings. FIG. 1 is a block diagram of a drive system according to the present embodiment. The drive system according to the present embodiment is a system that drives a vehicle by power of a battery installed on a vehicle, such as an electric vehicle, and a plug-in hybrid vehicle, etc; and charges the battery. The drive system may be installed on another device with a battery instead of a vehicle.

The drive system according to the present embodiment includes a power supply 30, an inverter (INV) 40, a motor 50, and a charge controller 100. The charge controller 100 controls charge of the battery 20 by managing a state of the battery 20, controlling the power input from the power supply 30, and controlling the charge power to the battery 20. Also, the charge controller 100 calculates a deterioration state of the battery 20. The charge controller (deterioration-state calculation system) 100 includes a controller 10, a charger 11, a voltage sensor 12, a current sensor 13, a temperature sensor 14, and a battery 20.

The controller 10 controls the charger 11 by obtaining detected values of the voltage sensor 12, the current sensor 13, and the temperature sensor 14. The controller 10 includes a charge control function for controlling charge of the battery 20, and a deterioration-state calculation function for calculating a deterioration state (SOH: State of Health) of the battery 20. The controller 10 includes a processor (CPU) and a memory, etc. To the memory, programs for performing various functions, such as a charge control function and deterioration-state calculation function included to the battery 20 are stored. Also, the processor is hardware for executing various programs stored in the memory. The processor performs various functions by executing the programs.

The charger 11 is connected between the battery 20 and power supply 30. The charger 11 is connected to the power supply 30. The charger 11 converts voltage input from the power supply 30 to voltage that is appropriate for charging the battery 20, and outputs the converted voltage as the charge voltage of the battery 20 to the battery 20. The charger 11 includes a voltage conversion circuit, and a switch, etc.

The voltage sensor 12 is a sensor for detecting the voltage between terminals of the battery 20. When the battery 20 is formed by a plurality of batteries, the voltage sensor 12 detects voltage between each terminal of the batteries. The voltage sensor 12 is connected between terminals of each battery included to the battery 20. The current sensor 13 is a sensor for detecting charge current of the battery 20. The current sensor 13 is connected between an output of the charger 11 and the battery 20. More, another current sensor is connected between the battery 20 and motor 50, and output current from the battery 20 to the motor 50 and input current from the motor 10 to the battery 20 are detected.

The temperature sensor 14 is a sensor for detecting temperature of the battery 20. The temperature sensor 14 is arranged to the battery 20 in a way directly attached to the battery 20. However, the temperature sensor 14 may be arranged to a position where the battery 20 can be indirectly detected.

The battery 20 includes a secondary battery (cell) such as a lithium-ion battery, etc. The secondary battery is connected in parallel or in series. The power supply 30 is an AC power supply for home use, or the like. The inverter 40 is connected between the battery 20 and motor 50, converts output power of the battery 20 to AC power, and outputs the AC power to the motor 50. During regenerative operation of the motor 50, the inverter 40 converts power of the motor 50 to DC power and outputs to the battery 20. The motor 50 is a drive source of the vehicle, such as a three-phase synchronous motor.

In the present embodiment, when the battery 20 is charged using an AC power supply provided at general home (for example, a case of normal charge), by electrically connecting an outlet included to the power supply 30 and the charger 11 arranged to the vehicle with a charging cable, the charger 11, battery 20, and power supply 30 are electrically connected. When charging the battery 20 using a charging device disposed outdoor (for example, a case of quick charge), the charger 11 and power supply 30 will be included to the outdoor charging device, and by electrically connecting a charging cable connected to the output of the charger 11, the battery 20 and power supply 30 are electrically connected.

Next, the charge control function of the controller 10 will be explained. The controller 10 controls charge of the battery 20 in a state where the battery of the vehicle is connected to the outdoor power supply or outdoor charging device by a charging cable. More, the controller 10 controls charge of the battery 20 due to regenerative operation of the motor connected to the battery while the vehicle is traveling. The controller 10, while managing a state of the battery 20 using the voltage sensor 12 and current sensor 13, executes charge control of the battery 20.

Figure 2:
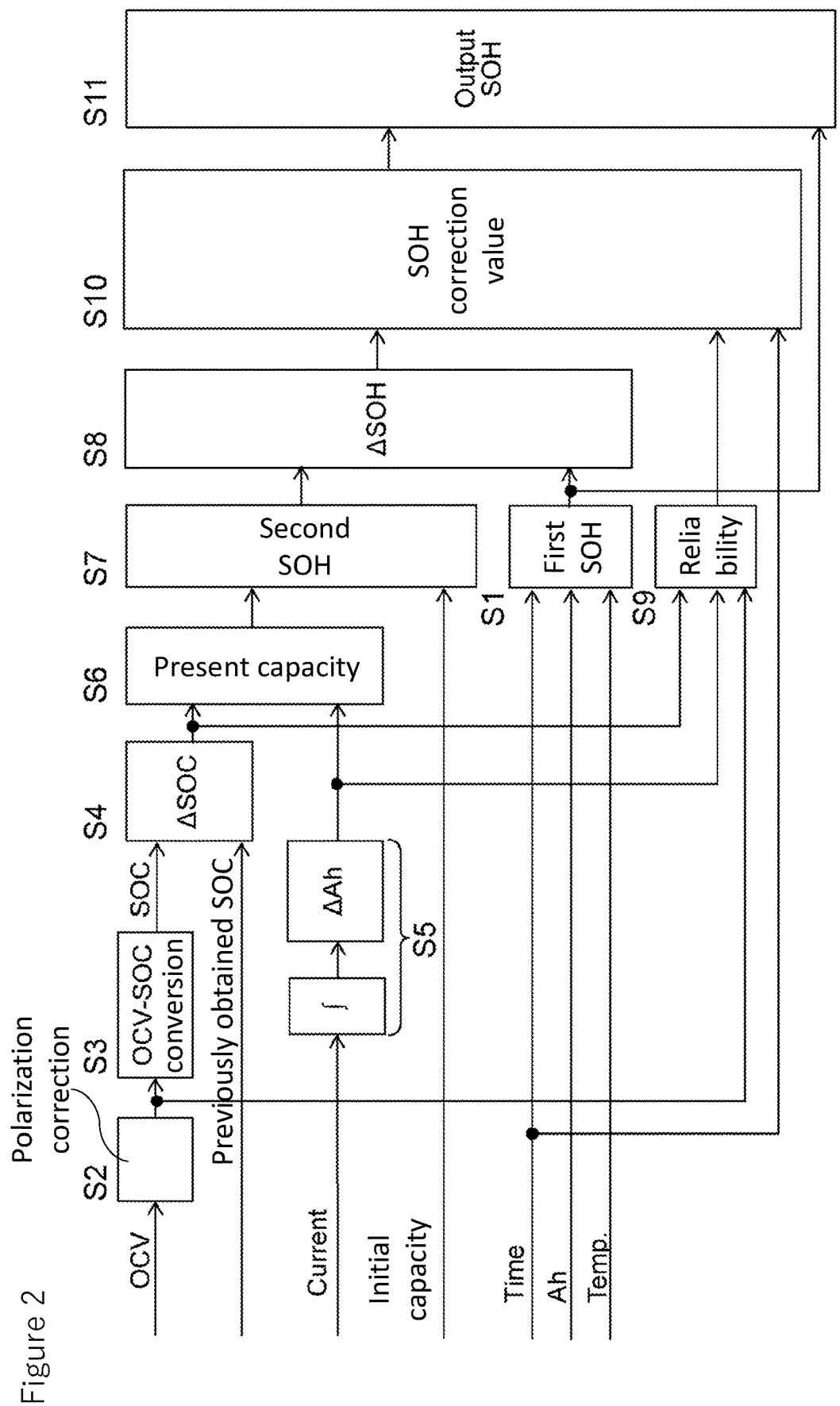
FIG. 2 is a functional block diagram of a controller of FIG. 1.

The deterioration-state calculation function of the controller 10 will be explained using FIG. 2. FIG. 2 is a block diagram illustrating the deterioration-state calculation function of the controller 10 by a functional block for each calculation processing. Each block shown in FIG. 2 indicates a control flow for calculation of a deterioration state. More, in the following explanation, there are indicated that as the value of the deterioration state (SOH) becomes small, deterioration of the battery is proceeding, and as the value of deterioration state (SOH) becomes greater, the state is close to the initial state. In other words, the deterioration state (SOH) is a present full-charge state of the battery 20 represented on the basis of a full-charge capacity in an initial state, and thus corresponds to a full battery capacity at the present. More, the deterioration state (SOH) calculated by the controller 10 is, for example, displayed to the display 60 arranged to a place visible from a driver such as an instrument panel or the like as a present full-charge capacity, or used for charge-discharge control, etc.

In Step S1, a deterioration state based on a period of use and amount of charge-discharge (hereafter, also called as a first deterioration state) is calculated by each predetermined interval. The predetermined interval is set to a period such as three months, for example. In the following, the predetermined interval is also called as a calculation cycle of the first deterioration state. The first deterioration state is a state of deterioration due to storage deterioration or cycle deterioration of a battery, and represents a deterioration state along with elapse of time from the start of use. The period of use indicates an elapsed time from the time the battery is started to be used. The start of use is, for example, a timing when a main switch first switched to an ON state from an OFF state. As the storage deterioration has correlation with the period of use, by managing the period of use, the controller 10 calculates a deterioration state due to storage deterioration. More, cycle deterioration of the battery 20 represents deterioration generated by repetition of charge and discharge, and has correlation with the amount of charge-discharge. The controller 10 detects a current value output from the battery 20 and a current value input to the battery 20 using a current sensor 13 while the battery 20 is being charged by the power from the outside vehicle while the vehicle is traveling. The amount of charge-discharge corresponds to an integration value of the current input or output from the battery from the start of use of the battery 20. Accordingly, by determining the amount of charge-discharge by integration of the detected current value, the controller 10 calculates cycle deterioration of the battery 20. The controller 10 stores a map showing relationships between the period of use, amount of charge-discharge, and deterioration state to a memory, and by referencing the map, calculates the first deterioration state based on the period of use and amount of charge-discharge. More, the controller 10 may calculate the first deterioration state using the temperature of the battery 20. The controller 10 detects a temperature history of the battery 20 for the period of use with the temperature sensor 14. Since the temperature also influences deterioration of the battery 20, the controller 10 may calculate the first deterioration state based on the correlation between the battery temperature and deterioration state.

In Step S2, the controller 10 detects an open-circuit voltage (OCV) of the battery 20 at a point when the main switch is switched from the OFF state to the ON state (hereafter, also called as an ON time point) using the voltage sensor 12. The main switch is a switch for switching ON and OFF of the entire vehicle and is operated by a user. The controller 10 corrects a detected open-circuit voltage (OCV) based on the polarization of the battery 20. When the battery 20 becomes an unloaded state from a loaded state, the voltage of the battery 20 does not become stable due to polarization. The polarization of the battery 20 is solved along with elapse of neglect time from a point the state is switched from the loaded state to the unloaded state. The controller 10 corrects the open-circuit voltage (OCV) according to the length of neglect time (the neglect time in the unloaded state) of the battery 20 before the ON time point of the main switch. The controller 10 corrects the open-circuit voltage so that the correction amount becomes greater as the neglect time becomes short.

In Step S3, the controller 10 calculates a state of charge of the battery 20 based on the corrected open-circuit voltage. To the memory of the controller 10, a map (a voltage-SOC map) showing corresponding relationships between the open-circuit voltage (OCV) and SOC of the battery 20 is stored. The controller 10 references the voltage-SOC map and calculates an SOC that corresponds to the detected voltage (corresponds to the open-circuit voltage) of the voltage sensor 12 at the ON time point.

In Step S4, the controller 10 obtains a previous SOC stored in a memory not shown in the figure and by finding out a difference between the present SOC and previous SOC to which calculation processing of Step S3 is performed, calculates a change amount ($\Delta SOC$) of the state of charge of the battery 20. The controller 10, for each ON time point, executes the calculation processing of Step S1 and Step S2, calculates open-circuit voltage and SOC, and stores the calculated values to the memory. The previous SOC is a calculated SOC at the previous ON time point.

In Step S5, the controller 10, detects an input-output current of the battery 20 in a predetermined sample cycle for the period between the ON time point to the point the main switch is switched to the OFF state from the ON state using the current sensor 13. Hereinafter, the point at which the main switch is switched to the OFF state from the ON state is called as OFF time point. Then, the controller 10 calculates a change amount of the amount of charge-discharge (ΔAh) by integrating the input-output current by the time between the ON time point to the OFF time point.

In step S6, the controller 10 divides the change amount of the amount of charge-discharge (ΔAh) by the calculated change amount of the state of charge (ΔSOC), and calculates a present battery capacity of the battery 20 (a present full-charge capacity).

In Step S7, by dividing the calculated present battery capacity by an initial capacity, the controller 10 calculates a second deterioration state. The controller 10 calculates the second deterioration state in an interval shorter than the predetermined period that is a calculation cycle of the first deterioration state. The second deterioration state is a value calculated based on a battery state change in a period shorter than the first deterioration state. The calculation cycle of the second deterioration state is, for example, a period from the previous ON time point to the present ON time point. The initial capacity is the full-charge capacity in the initial state of the battery 20. The controller 10 performs the calculation processing of the second deterioration state as described above for a plurality of times within a calculation cycle (a predetermined period) of the first deterioration state. For example, when the calculation cycle (the predetermined period) of the first deterioration state is three months and when the vehicle is used once a day, the controller executes the calculation processing of the second deterioration state for about ninety times or more.

In step S8, the controller 10 calculates a difference (ΔSOH) for each of the second deterioration state and the first deterioration state which are calculated for a plurality of times within a calculation cycle of the first deterioration state. Deterioration of the battery 20 also proceeds by storage deterioration as shown in the first deterioration state in addition to deterioration due to input load in a short time as shown in the second deterioration state. For this reason, in the present embodiment, in order to reflect the cause of deterioration shown in the first deterioration state to the second deterioration state, a ΔSOH is calculated by subtracting the second deterioration state from the first deterioration state.

In Step S9, the controller 10 calculates reliability of calculations for the change amount of the state of charge (ΔSOC) calculated in Step S4 and the change amount of the amount of charge-discharge (ΔAh) calculated in Step S5. A calculation error of the change amount of the state of charge (ΔSOC) is affected by polarization of the battery 20 and an SOC-OCV characteristic line (a line showing a change of SOC relative to the change of OCV). Also, the calculation error of the change amount of the amount of charge-discharge (ΔAh) changes along with the size of the average current. Then, when the second deterioration state is calculated based on the change amounts of the state of charge and the amount of charge-discharge (ΔSOC and ΔAh) having greater error, calculation accuracy of the deterioration state becomes low. For this reason, in the calculation processing in Step S9, in order to raise calculation accuracy of the deterioration state, reliability of the change amounts of the state of charge and the amount of charge-discharge (ΔSOC and ΔAh) is evaluated and in the calculation processing of Step S10 described in the following, a deterioration state is calculated according to the reliability.

A calculation method for reliability will be explained. The controller 10, based on the detected voltage (CCV: voltage between terminals) detected by the voltage sensor 12. for the present ON time point, calculates a calculation error of the change amount of the state of charge (ΔSOC) by adding up the calculation error of the present SOC and the calculation error of the previous SOC calculated at the previous ON time point. Specifically, the controller 10 calculates a calculation error based on the magnitude of the polarization voltage included to the detected voltage at the present ON time point and a calculation error based on the SOC at the present ON time point respectively, and by adding these calculation errors, calculates a calculation error of the present SOC.

The controller 10 measures a charge-discharge time from the previous ON time point to the present ON time point and a neglect time (unloaded time) to the ON time point for calculation of the magnitude of the polarization voltage. The neglect time corresponds to time between the previous OFF time point to the present ON time point and is a period where the charge-discharge current value of the battery 20 is zero. The controller 10 calculates so as to make the polarization voltage greater as the charge-discharge time becomes longer, and the polarization voltage greater as the neglect time becomes shorter. The controller 10 calculates a calculation error for the present SOC in a way the calculation error becomes smaller as the polarization voltage included to the detected voltage of the battery 20 used for calculation of the present SOC becomes smaller. More, as the magnitude of the polarization voltage changes along with the deterioration state of the battery 20, the controller 10 may calculate the magnitude of the polarization voltage based on the deterioration state of the battery 20.

The controller 10, by referencing the SOC-OCV characteristic line stored in the memory, calculates a calculation error for the present SOC so that the calculation error becomes smaller as the SOC change relative to the OCV change for the present SOC on the SOC-OCV characteristic line becomes small.

Then, by adding up the calculation error of the present SOC based on the polarization voltage and the calculation error of the present SOC based on the SOC, the controller 10 calculates a final calculation error for the present SOC. The controller 10 stores the calculated calculation error for the present SOC. The controller 10 calculates an estimated error of ΔSOC by adding up the calculation error of the previous SOC and calculation error of the present SOC stored in the memory.

The controller 10 calculates average current from the previous ON time point to the present ON time point and calculates a calculation error (ΔAh) of the change amount of the amount of charge-discharge so as to make the calculation error of the change amount of the amount of charge-discharge (ΔAh) smaller as the average current becomes small. The average current can be obtained by dividing a current integration value from the previous ON time point to the present OFF time point by the integration time (time between the previous ON time point to the present ON time point).

The controller 10 calculates reliability of the calculation of the change amounts of the state of charge and the amount of charge-discharge (ΔSOC and ΔAh) so as to make the reliability of calculation of the change amounts of the state of charge and the amount of charge-discharge (ΔSOC and ΔAh) higher as the calculated calculation error of the change amount of the state of charge (ΔSOC) smaller and the reliability of calculation of the change amounts (ΔSOC and ΔAh) higher as the calculated calculation error of the change amount of the amount of charge-discharge (ΔAh) becomes smaller. More, since the change amounts of the state of charge and the amount of charge-discharge (ΔSOC and ΔAh) are used for calculating the second deterioration state, reliability of calculation of the change amounts of the state of charge and the amount of charge-discharge (ΔSOC and ΔAh) corresponds to reliability of the calculation of the second deterioration state.

In Step S10, the controller 10 calculates a correction value (SOH correction value) of the deterioration state based on the ΔSOH, reliability, and neglect time. As described above, as the calculation processing of the second deterioration state is executed for a plurality of times during the calculation period of the first deterioration state, ΔSOC, ΔAh, SOC, ΔSOH, and reliability are calculated for a plurality of times. Among the plurality of ΔSOHs, to specify a value suitable for calculation of the SOH correction value, the controller 10 adds weighting that corresponds to the reliability against each ΔSOH while evaluating the neglect time that corresponds to each ΔSOC.

First, the controller 10 compares the neglect time relative to ΔSOH calculated within the calculation period of the first deterioration state and predetermined time. The neglect time for the ΔSOH is the neglect time of the SOC used for calculation of the ΔSOH up to the present ON time. When the neglect time is longer than the predetermined time, the controller 10 specifies the ΔSOH that corresponds to the neglect time as a value appropriate for calculation of the correction value. Whereas, when the neglect time is below the predetermined time, the controller 10 judges that the ΔSOH that corresponds to the neglect time is not appropriate for calculation of the correction value and excludes from the target of correction value calculation.

The controller 10 adds weighting to the specified ΔSOH as a calculation target according to the reliability. The reliability corresponds to the calculation error of the SOC, and the controller 10 adds weighting to each ΔSOH so as to make the effect of the SOH correction value to the calculation becomes greater as the reliability of ΔSOH becomes high when calculating the SOH correction value. Then, the controller 10, based on the plurality of ΔSOHs including the weighting, calculates an SOH correction amount. Specifically, the controller 10 calculates the correction value by calculating an average value of each SOH or calculating such as an approximate value, etc., of each average value. The correction value is represented by a difference of SOH.

In Step S11, the controller 10 corrects the first deterioration state by adding the calculated correction value to the first deterioration state calculated by the calculation processing of Step S1 and calculates the deterioration state (SOH) of the battery 20.

Figure 3:
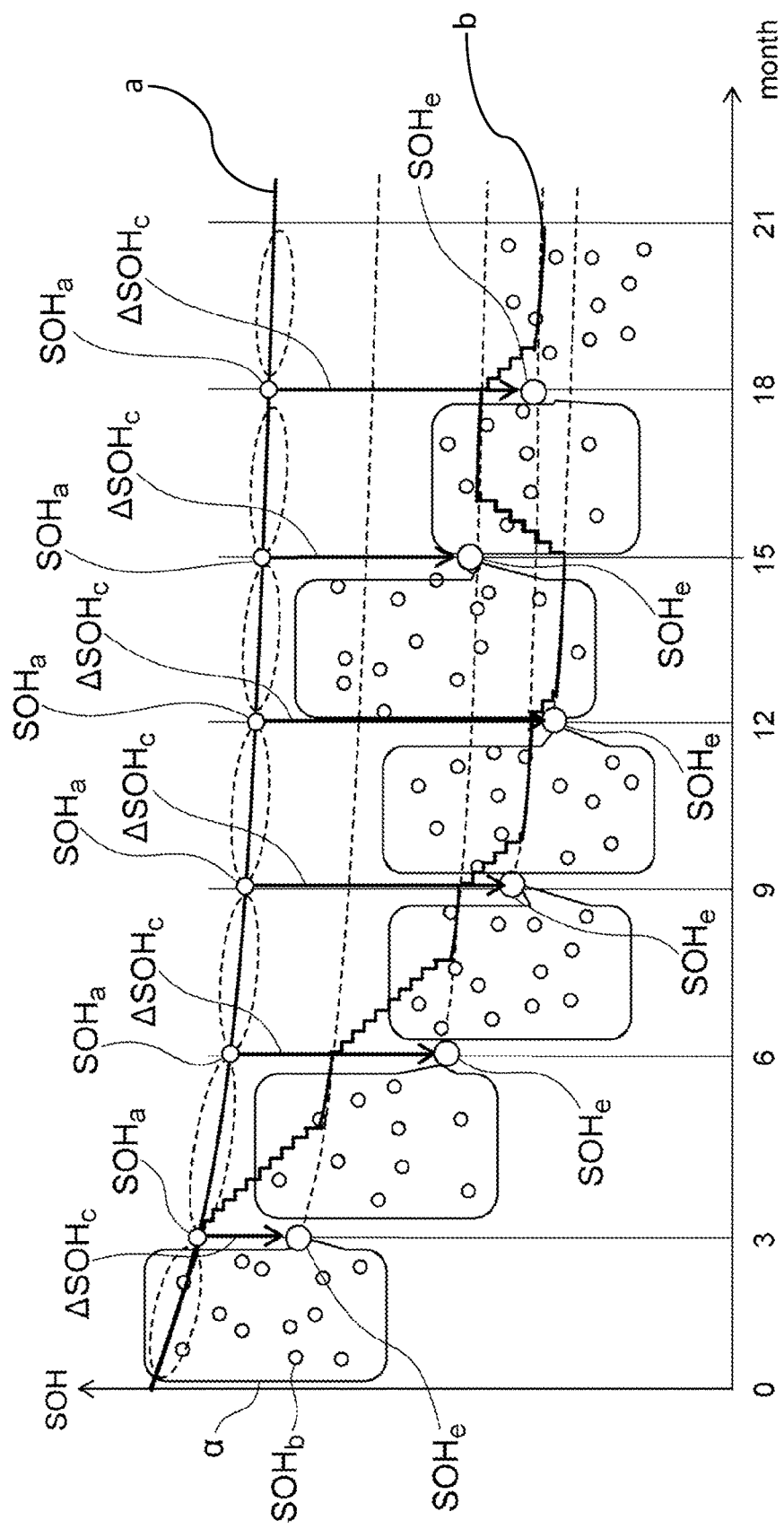
FIG. 3 is a graph for explaining a time chart of calculation processing of a deterioration state.

Next, using FIG. 3, a time chart of the calculation processing for the deterioration state will be explained. FIG. 3 is a graph for explaining calculation timings for the first deterioration state, second deterioration state, SOH correction value, and corrected deterioration state. In FIG. 3, $SOH_a$ represents the first deterioration state, $SOH_b$ represents the second deterioration state, $\Delta SOH_c$ represents an SOH correction value, and $SOH_e$ represents deterioration state after correction. The horizontal axis of FIG. 3 represents time and the vertical axis represents SOH. Graph a shows time transition of the first deterioration state, and graph b represents a time transition of the deterioration state output from the controller 10.

A calculation cycle for the first deterioration state is three months. The controller 10 calculates the first deterioration state by three months such as after three months, after six months, and after nine months, etc., using the time the battery 20 is started to be used as the starting point. As the first deterioration state represents deterioration along with elapse of time, the first deterioration state declines along with elapse of time as shown in graph a.

The controller 10 calculates the second deterioration state at a plurality of switching timings of the main switch executed within three months period. In the example of FIG. 3, in the period up to three months from the start of use, there are twelve ON periods of the main switch (the period when the main switch switches from the OFF state to the ON state and then the main switch switches from the ON state to the OFF state), the controller 10 calculates the second deterioration state for twelve times. The circles surrounded by area a in FIG. 3 represents the second deterioration state. The second deterioration state changes such as by the state of the battery 20 and calculation error, etc., and thus the second deterioration state is represented by a discrete value as shown in FIG. 3.

At the point the calculation cycle of the first deterioration state has elapsed, the controller 10 calculates the first deterioration state $SOH_a$, and calculates the reliability for each of the second deterioration state $SOH_b$ calculated within the calculation cycle of the first deterioration state. The controller 10 specifies the second deterioration state targeted for calculation when calculating the SOH correction value according to the calculated reliability, and calculates a change amount of the state of change (ΔSOH) by determining a difference between the specified second deterioration state $SOH_b$ and the first deterioration state $SOH_a$. The controller 10 adds weighting to the calculated change amount of the state of charge (ΔSOH) according to the reliability. For example, at the time when three months have elapsed from the start of use, the controller 10 calculates the first deterioration state $SOH_a$, and calculates reliability for each of the second deterioration state $SOH_b$ included to area a. Also, the controller 10 specifies the second deterioration state $SOH_b$ targeted for calculation target of the SOH correction value from the second deterioration state $SOH_b$ included to area a. For example, among 12 second deterioration states $SOH_b$ contained in area a, as to the two second deterioration states $SOH_b$, the two deterioration states $SOH_b$ are excluded from the calculation when the neglect time is shorter than the predetermined time. The controller 10 calculates the change amount of the state of charge (ΔSOH) from the remaining 10 second deterioration state $SOH_b$ and first deterioration state $SOH_a$, and adds weighting to each change amount of the state of charge (ΔSOH).

The controller 10 calculates an SOH correction value (ΔSOH) by adding 10 change amounts of the state of charge (ΔSOHs) including the weighting. The controller 10 adds the SOH correction value ($\Delta SOH_c$) to the first deterioration state ($SOH_a$) and calculates the deterioration state ($SOH_e$) after correction.

When correcting the deterioration state, the controller 10 gradually corrects the deterioration state and outputs the deterioration state after correction. When the correction value of the deterioration state is high, the deterioration state may greatly change by the correction of the deterioration state. For this reason, the controller 10 gradually corrects the deterioration state after making the actual correction value smaller than the calculated correction value. As shown in graph b, the deterioration state after correction output from the controller 10 gradually changes from the time the first deterioration state has elapsed. More, when gradually correcting the deterioration state, the correction amount or number of correction times of the deterioration state is determined in advance. To the calculated SOH correction value, the controller 10 corrects the deterioration state according to the predetermined correction amount or the number of correction times.

As above, the charge controller 100 according to the present embodiment detects current and voltage of the battery 20 using the voltage sensor 12 and current sensor 13, and calculates a state of charge of the battery 20 based on the detected value by the voltage sensor 12 or current sensor 13. The charge controller 100 calculates the first deterioration state of the battery 20 for each calculation cycle of the first deterioration state based on the elapsed time from the time the battery 20 is started to be used and the amount of charge-discharge of the battery 20, and calculates the second deterioration state of the battery 20 based on the change amount of the state of charge of the battery 20 and change amount of the current of the battery 20. The charge controller 100 executes calculation processing for several times for calculating the second deterioration state within a calculation cycle of the first deterioration state, calculates reliability of calculation of the second deterioration state for each of the plurality of second deterioration states, calculates a correction value of the deterioration state based on the second deterioration state with reliability of a predetermined reliability or higher, and by correcting the first deterioration state by the correction value, calculates the deterioration state. In this way, calculation accuracy of the deterioration state can be raised.

Also, the charge controller 100 according to the present embodiment calculates a correction value by adding weighting that corresponds to the level of the reliability of the second deterioration state. In this way, calculation accuracy of the deterioration state can be raised.

More, the charge controller 100 according to the present embodiment raises reliability as the polarization voltage of the battery 20 becomes small, the average current of the battery 20 decreases, or the change amount of the SOC of the battery 20 becomes smaller. In this way, calculation accuracy of the deterioration state can be raised.

Further, in the present embodiment, weighting is increased as reliability becomes high. In this way, calculation accuracy of the deterioration state can be raised.

Additionally, as a modified example of the charge controller 100 according to the present embodiment, the controller 10 may set the calculation cycle of the first deterioration state so as to make the calculation processing of the second deterioration state per calculation cycle of the first deterioration state becomes the predetermined number of times or more. For example, when the calculation cycle of the first deterioration state is short and the number of calculation times of the second deterioration state within the calculation cycle is few, the number of samples (the number of the value of the second deterioration state) used for calculating the correction value is few and the calculation accuracy may become low. For this reason, when the number of calculation times of the second deterioration state is few, the controller 10 sets the calculation cycle of the first deterioration state so as to make the number of calculation times of the second deterioration state within the calculation cycle of the first deterioration state the predetermined number of times or more. In this way, the number of samples used for calculating the correction value increases and thus the calculation accuracy of the deterioration state can be raised.

Also, as the modified example of the charge controller 100 according to the present embodiment, the calculation cycle of the first deterioration state may be set so that the second deterioration state with the predetermined reliability or higher becomes the predetermined number of times per calculation cycle of the first deterioration state or more. For example, when the second deterioration state with the reliability of the predetermined value or more is not calculated for the number of predetermined times or more within the calculation cycle of the first deterioration state, the number of samples with high reliability becomes insufficient and the calculation accuracy may become low. Accordingly, when the number of samples of the second deterioration state with high reliability is few, the controller 10 extends the calculation cycle of the first deterioration state and sets the calculation cycle of the first deterioration state so as to make the second deterioration state with the predetermined reliability or higher per calculation cycle become the predetermined number of times or more. In this way, the number of samples with high reliability increases and calculation accuracy of the deterioration state can be raised.

Figure 4:
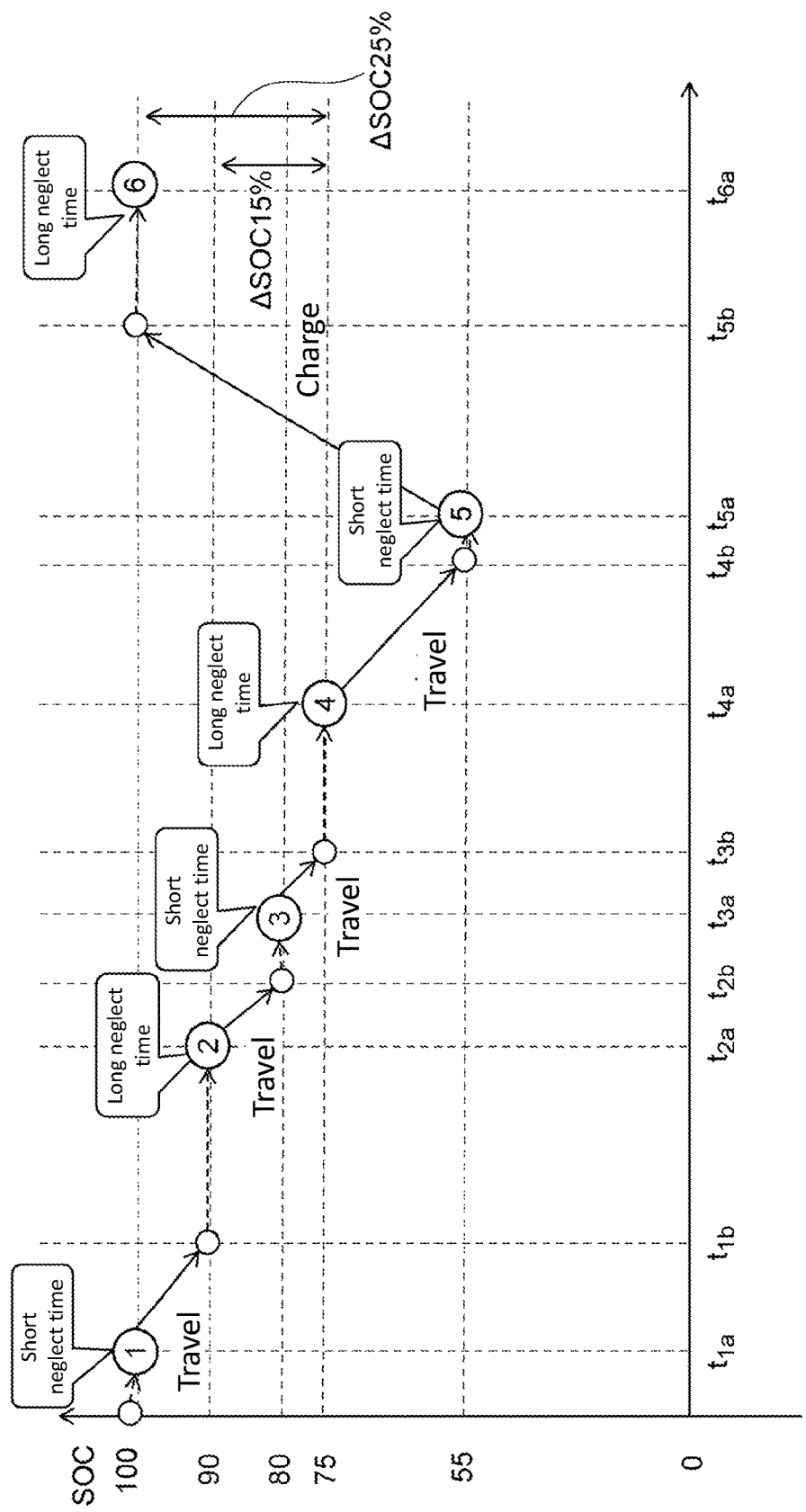
FIG. 4 is a diagram for explaining a modified example of the present embodiment and is a graph showing time transition of an SOC.

Also, as a modified example of the charge controller 100 according to the present embodiment, the controller 10 may select any from the plurality of ON time points as in the difference between the one before the previous SOC and present SOC, for example, instead of the difference between the present SOC and previous SOC when calculating the change amount of the state of charge ($\Delta$SOC). FIG. 4 is a figure for explaining a modified example and is a graph showing a time transition of the SOC at the ON time point and OFF time point. In FIGS. 4, $t_{1a}$ to $t_{6a}$ indicate the ON time points and $t_{1b}$ to $t_{5b}$ indicate the OFF time points. Also, the period between $t_{1a}$ to $t_{1b}$, the period between $t_{2a}$ to $t_{2b}$, the period between $t_{3a}$ to $t_{3b}$, and the period between $t_{4a}$ to $t_{4b}$ show the time while the vehicle is traveling, and the period between $t_{5a}$ to $t_{5b}$ shows the period of charge by the outdoor charging device.

The controller 10 calculates an SOC at the timing of each ON time point. The controller 10 selects the SOC for determining a difference so as to make the reliability of calculation of the change amount of the state of charge ($\Delta$SOC) becomes high when calculating the change amount of the state of charge ($\Delta$SOC). In the example of FIG. 4, when the second ON time point ($t_{2a}$) and the fourth ON time point ($t_{4a}$) are selected when calculating the change amount of the state of charge ($\Delta$SOC), the change amount of the state of charge ($\Delta$SOC) becomes 15%. When calculating the change amount of the state of charge ($\Delta$SOC) and when the controller 10 selects the fourth ON time point ($t_{4a}$) and sixth ON time point ($t_{6a}$), the change amount of the state of charge ($\Delta$SOC) becomes 25%. The greater the change amount of the state of charge ($\Delta$SOC), the greater the calculation error, and thus the controller 10, in order to make the calculation error small in the above example, selects the second ON time point ($t_{2a}$) and the fourth ON time point ($t_{4a}$) and calculates the change amount of the state of charge ($\Delta$SOC) by determining the difference of the SOCs at the selected ON time points.

Further, when calculating the change amount of the state of charge ($\Delta$SOC), the controller selects an SOC of the low polarization voltage so as to raise the reliability of calculation of the change amount of the state of charge ($\Delta$SOC). In the example of FIG. 4, the neglect time before the first ON time point, the neglect time before the third ON time point, and the neglect time before the fifth ON time point are short, and the neglect time before the second ON time point, the neglect time before the fourth ON time point, and the neglect before the sixth ON time point are long. The shorter the neglect time, the smaller the polarization voltage, and thus the calculation error of the SOC becomes small. For this reason, the controller 10 calculates the change amount of the state of charge (ΔSOC) based on the SOC of the ON time point after the neglect time longer than the predetermined time has elapsed. In this way, calculation accuracy of the deterioration state can be raised.

As a modified example of the present embodiment, the controller 10 may calculate the magnitude of the polarization voltage according to the magnitude of the charge-discharge current just before the ON time point. The polarization voltage included to the detected voltage of the battery 20 changes along with the current of the battery 20. In the present embodiment, in the calculation processing of Step S10, in a case where the neglect time is the predetermined time or below, since the case is excluded from the calculation target for the SOH correction value, the SOC when the neglect time is short and charge-discharge current is great is excluded and influence to the polarization voltage due to the size of the current value is substantially eliminated. Accordingly, as in the calculation processing of Step S10, when the calculation target is not limited by the length of neglect time, the controller may calculate the polarization voltage according to the magnitude of the charge-discharge current.

[Description of Reference Numerals]
10 . . . controller
11 . . . charger
12 . . . voltage sensor
13 . . . current sensor
14 . . . temperature sensor
20 . . . battery
30 . . . power supply
40 . . . inverter
50 . . . motor
100 . . . charge controller

What is claimed is:

1. A deterioration-state calculation method for calculating a deterioration state of a battery by using a processor for managing a state of the battery, comprising:
   detecting current of the battery and voltage of the battery by using a sensor;
   calculating a state of charge of the battery based on a detected value of the sensor;
   calculating a first deterioration state of the battery for each predetermined period based on an elapsed time from the start time of using the battery and an amount of charge-discharge of the battery;
   calculating a second deterioration state of the battery based on a change amount in the state of charge of the battery and a change amount of current of the battery;
   executing calculation step for calculating the second deterioration state for a plurality of times within the predetermined period;
   calculating reliability of calculation of the second deterioration state for each of a plurality of the second deterioration states based on the detected value;
   calculating a correction value of the deterioration state based on the second deterioration state with the reliability of the predetermined reliability or higher; and
   calculating the deterioration state by correcting the first deterioration state by the correction value.

2. The deterioration-state calculation method according to claim 1, wherein
   the correction value is calculated by adding weighting that corresponds to the level of reliability of the second deterioration state.

3. The deterioration-state calculation method according to claim 1, wherein
   the reliability increases as polarization voltage of the battery becomes smaller, average current of the battery becomes lower, or a change amount of the state of charge of the battery becomes smaller.

4. The deterioration-state calculation method according to claim 2, wherein the weighting is increased as the reliability becomes high.

5. The deterioration state calculation method according to claim 1, wherein as the elapsed time becomes longer, or as the amount of charge-discharge becomes greater, the first deterioration state becomes lower.

6. The deterioration-state calculation method according to claim 1, wherein a number of calculation times of the calculation step of the second deterioration state is equal to or more than a predetermined number of times in the predetermined period.

7. The deterioration-state calculation method according to claim 1, wherein
   the second deterioration state with the reliability of the predetermined reliability or higher is calculated for a predetermined number of times or more in the predetermined period.

8. A deterioration-calculation system comprising:
   a sensor for detecting current of a battery and voltage of the battery; and
   a processor for managing a state of the battery, wherein the processor
      calculates a state of charge of the battery based on a detected value of the sensor;
      calculates a first deterioration state of the battery for each predetermined period based on an elapsed time from the start of battery use and an amount of charge-discharge of the battery;
      calculates a second deterioration state of the battery based on a change amount of a state of charge of the battery and a change amount of current of the battery;
      executes calculation step for calculating the second deterioration state for a plurality of times within the predetermined period;
      calculates reliability of the calculation of the second deterioration state for each of a plurality of the second deterioration states based on the detected value;
      calculates a correction value of the deterioration state based on the second deterioration state with the reliability of the predetermined reliability or higher; and
      calculates the deterioration state of the battery by correcting the first deterioration state by the correction value.

* * * * *